US008501958B2

(12) United States Patent
Kim et al.

(10) Patent No.: US 8,501,958 B2
(45) Date of Patent: Aug. 6, 2013

(54) COMPOUND ABSORBING SUNLIGHT AND CONVERTING THE SUNLIGHT INTO ELECTRICAL ENERGY, AND METHOD FOR MANUFACTURING THE SAME

(75) Inventors: Youngkyoo Kim, Daegu (KR); Minjung Shin, Daegu (KR); Inhyuk Lee, Daegu (KR); Hwajeong Kim, Daegu (KR)

(73) Assignee: Kyungpook National University Industry- Academic Cooperation Foundation, Daegu (KR)

( * ) Notice: Subject to any disclaimer, the term of this patent is extended or adjusted under 35 U.S.C. 154(b) by 23 days.

(21) Appl. No.: 12/671,428

(22) PCT Filed: Jan. 9, 2009

(86) PCT No.: PCT/KR2009/000122
§ 371 (c)(1),
(2), (4) Date: Jan. 29, 2010

(87) PCT Pub. No.: WO2009/088249
PCT Pub. Date: Jul. 16, 2009

(65) Prior Publication Data
US 2010/0274024 A1      Oct. 28, 2010

(30) Foreign Application Priority Data
Jan. 9, 2008 (KR) .................. 10-2008-0002766

(51) Int. Cl.
*C07D 209/82* (2006.01)
*C07D 305/18* (2006.01)
(52) U.S. Cl.
USPC ............................................. 548/416; 558/28
(58) Field of Classification Search
None
See application file for complete search history.

(56) References Cited

U.S. PATENT DOCUMENTS

2006/0081840 A1 * 4/2006 Mori et al. ........................ 257/40
2007/0096066 A1 * 5/2007 Yoshida et al. ................. 252/511
2009/0205713 A1 * 8/2009 Mitra et al. ..................... 136/263

FOREIGN PATENT DOCUMENTS

| JP | 09-316202 A | 12/1997 |
| JP | 2005-263692 A | 9/2005 |
| JP | 2007-063364 A | 3/2007 |
| JP | 2007129170 A * | 5/2007 |
| KR | 10-1999-0062697 A | 7/1999 |
| WO | WO 2004007426 A1 * | 1/2004 |

OTHER PUBLICATIONS

Sumpter et al., International Journal of Quantum Chemistry (2008), vol. 109, pp. 97-118.*
Padmawar et al. Chemistry Materials (2006), 18(17), pp. 4065-4756.*

* cited by examiner

*Primary Examiner* — Nyeemah A Grazier
(74) *Attorney, Agent, or Firm* — Reinhart Boerner Van Deuren P.C.

(57) ABSTRACT

A compound for absorbing sunlight and converting the sunlight into electrical energy, which is formed by coupling a fullerene with at least one or more triarylamine derivatives. The fullerene is selected from among those having carbon numbers $C_{60}$, $C_{70}$, $C_{78}$, $C_{82}$ and $C_{84}$, and the triarylamine derivatives are coupled with at least one or more aliphatic or aromatic hydrocarbons and are also coupled with a dopant. A method of manufacturing the compound includes steps of synthesizing a fullerene derivative, synthesizing fullerene-triarylamine, wherein a fullerene-triarylamine adduct is prepared by coupling the fullerene derivative with a triarylamine derivative, preparing an adduct solution by dissolving the fullerene-triarylamine adduct in an organic solvent, and conducting a doping reaction by adding an acid dropwise slowly to the adduct solution.

17 Claims, 4 Drawing Sheets

COMPOUND ABSORBING SUNLIGHT AND CONVERTING THE SUNLIGHT INTO ELECTRICAL ENERGY, AND METHOD FOR MANUFACTURING THE SAME

CROSS-REFERENCE TO RELATED PATENT APPLICATIONS

This patent application is the National Stage of International Application No. PCT/KR2009/000122, filed Jan. 9, 2009, that claims the benefit of Korean Application No. 10-2008-0002766, filed Jan. 9, 2008, the entire teachings and disclosure of which are incorporated herein by reference thereto.

TECHNICAL FIELD

The present invention relates to a compound for absorbing sunlight and converting the sunlight into electrical energy, a method for manufacturing the same and application forms thereof. More particularly, the present invention relates to a compound formed by coupling a fullerene with at least one or more triarylamine derivatives, wherein the fullerene is selected from among those having carbon numbers $C_{60}$, $C_{70}$, $C_{78}$, $C_{82}$ and $C_{84}$, and the triarylamine derivatives are coupled with at least one or more aliphatic or aromatic hydrocarbons and also coupled with a dopant.

BACKGROUND ART

Since the amount of solar energy is limitless, it is inexhaustible and entails little environmental pollution. Research into the conversion of solar energy into electrical energy is underway due to these characteristics of solar energy.

A solar battery has been used as a method of converting solar energy into electrical energy since the 1980s. A solar battery is a photocell which is produced with the aim of converting solar energy into electrical energy. A solar battery can be broadly divided into 'a solar thermal cell' and 'a photocell'. While the solar thermal battery is a device that uses solar thermal energy to generate steam, which is needed to rotate a turbine, the photocell is a device for converting the sunlight into electrical energy using the characteristics of the semiconductor. The intensity of research and development pertaining to photocells has increased recently.

The first material used in preparing solar batteries is single-crystal silicon. Although the relative importance of the solar battery in the marketplace has been low, these days its market importance is increasing, especially in the large-scale generating system field. That is why the conversion efficiency of solar batteries made from single-crystal silicon is much higher than that of other solar batteries made from other materials.

However, if a solar battery is prepared from single-crystal silicon, it entails some problems, such as the high cost of production, a complicated process, etc. To solve these problems, there have been attempts to prepare a solar battery from organic materials. If a solar battery is prepared from organic materials, the cost of production can be lowered and mass production on an industrial scale is possible. Moreover, if organic material is used as a raw material, there are advantages in that the weight is reduced and thus the battery is simple and convenient. Further, since organic material is flexible, unlike inorganic material, the shape of the battery is not limited, and can be widely applied in various fields.

However, if a solar battery is prepared from organic material, it has a problem in that the photovoltaic conversion efficiency, that is, energy conversion efficiency, is lower than that of the battery made of silicon. Further, if a solar battery is prepared from organic material, the yield of the target product must be raised to increase productivity, and mass production is needed in order to reduce production costs.

DISCLOSURE

Technical Problem

The present invention has been made to solve the foregoing problems with the prior art, and therefore an object of the present invention is to provide a compound formed by coupling a fullerene with at least one or more triarylamine derivatives, a method for manufacturing the same and application forms thereof, wherein the triarylamine derivatives are coupled with at least one or more aliphatic or aromatic hydrocarbons, and is also coupled with a dopant to control the length of the triarylamine part and the doping ratio, so that it absorbs various wavelengths of sunlight to increase light conversion efficiency, and the compound can be easily mass-produced.

Technical Solution

According to an aspect of the present invention, a compound absorbing sunlight and converting the sunlight into electrical energy may contain a fullerene derivative and at least one or more triarylamine derivatives coupled with the fullerene derivative.

The fullerene derivative can be selected from among fullerene derivatives having carbon numbers $C_{60}$, $C_{70}$, $C_{78}$, $C_{82}$ and $C_{84}$.

The triarylamine derivatives can be coupled with at least one or more aliphatic or aromatic hydrocarbons, and can also be coupled with a dopant.

The aliphatic or aromatic hydrocarbons can be coupled with at least one or more triarylamines.

The dopant can be an acid, which is selected from the group consisting of benzenesulfonic acid, sulfuric acid ($H_2SO_4$), and antimony fluoride ($SbF_6$).

According to another aspect of the present invention, a method of manufacturing a compound for absorbing sunlight and converting it into electrical energy may include the following steps of: synthesizing a fullerene derivative; synthesizing fullerene-triarylamine, wherein a fullerene-triarylamine adduct is prepared by coupling the fullerene derivative with a triarylamine derivative; preparing an adduct solution by dissolving the fullerene-triarylamine adduct in an organic solvent; and conducting a doping reaction by adding an acid dropwise slowly to the adduct solution.

The fullerene derivative can be selected from among those having carbon numbers $C_{60}$, $C_{70}$, $C_{78}$, $C_{82}$ and $C_{84}$.

In the step of synthesizing the fullerene derivative, the fullerene and an N-substituted glycine can be heated in toluene to provide a fullerene derivative.

In the step of synthesizing the fullerene-triarylamine, the triarylamine derivative can be synthesized by selecting one from the group consisting of bromotriarylamine, iodotriarylamine and chlorotriarylamine, and reacting the synthesized fullerene derivative with the selected triarylamine and 2-phenylphenol in an organic solvent.

The fullerene and the N-substituted glycine can be heated with a molar ratio of ranging from 0.1:1 to 10:1 in toluene for a time period ranging from an hour to 24 hours at a temperature ranging from room temperature to 300° C., to produce a fullerene derivative.

The molar ratio of the fullerene derivative to the triarylamine derivative can be from 0.1:1 to 10:1, and the reaction can be conducted at a temperature ranging from room temperature to 300° C. for a time period ranging from 8 hours to 72 hours.

The organic solvent at the step of preparing the adduct solution can be selected from the group consisting of toluene, xylene, chlorobenzene, and dichlorobenzene.

The dopant at the step of conducting a doping reaction can be an acid, which is selected from the group consisting of benzenesulfonic acid, sulfuric acid ($H_2SO_4$), and antimony fluoride ($SbF_6$).

According to another aspect of the present invention, a solar battery comprises at least one of the above-mentioned compounds for absorbing sunlight and converting it into electrical energy.

According to a further aspect of the present invention, a transistor comprises at least one of the above-mentioned compounds for absorbing sunlight and converting it into electrical energy.

Advantageous Effects

As set forth above, according to the compound of the present invention, which absorbs sunlight and converts the sunlight into electrical energy, because a solar battery can be prepared from organic material, it can be mass-produced to reduce the cost of production and to be more economical. In addition, the present invention has the effect of converting solar energy, which is inexhaustible, into electrical energy to accelerate the development of alternative energy sources in response to the shortage of energy. Further, the solar battery has effects such as easy processability and a convenient portability compared to those made from inorganic material.

BEST MODE

Figure 1:
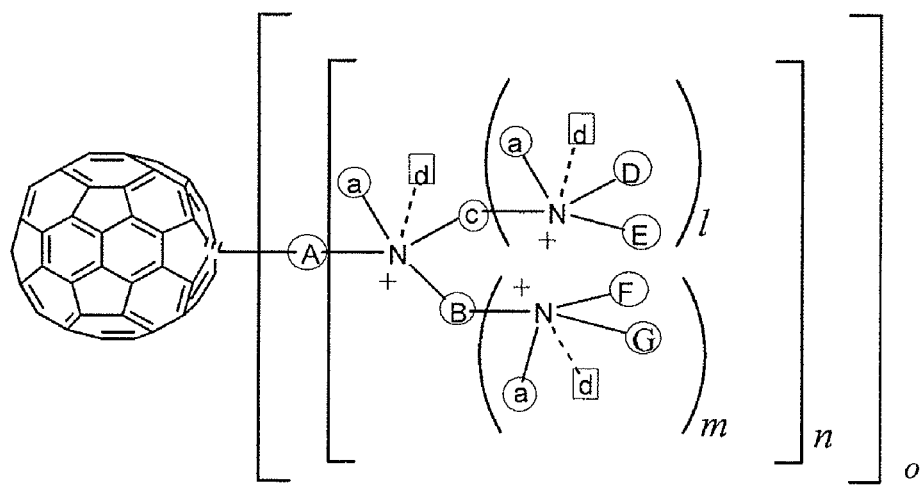
FIG. 1 is a view schematically showing a compound of the present invention for absorbing the sunlight and converting it into electrical energy.
Figure 2:
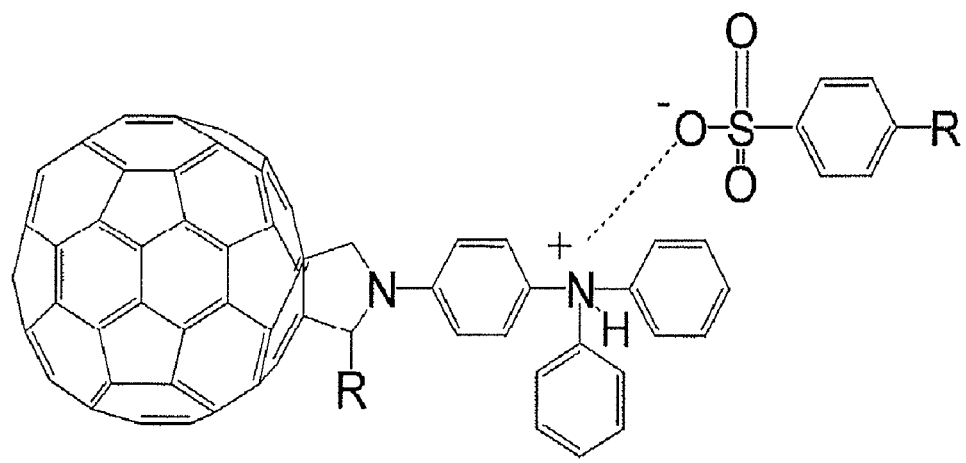
FIG. 2 is a view showing a fullerene-triarylamine, to which a dopant is coupled, in which the fullerene-triarylamine is formed by coupling a fullerene derivative with a triarylamine derivative.
Figure 3:
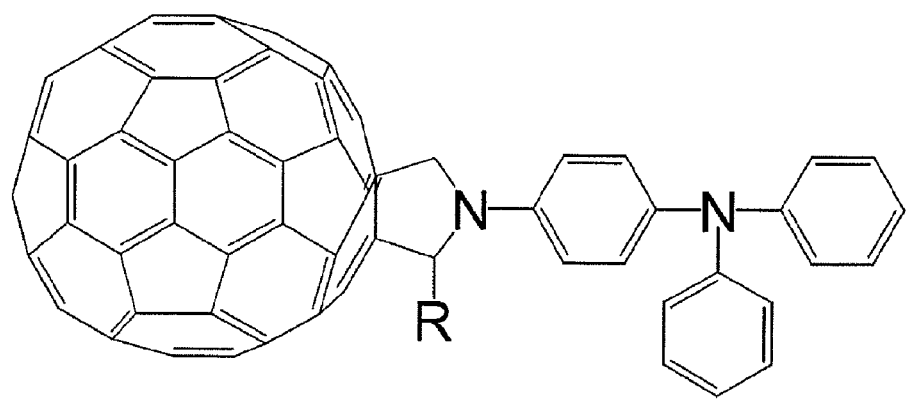
FIG. 3 is a view showing an adduct prepared according to an example of the present invention.

Now, the present invention will be described in detail by referring to the attached drawings. FIG. 1 is a view schematically showing a compound of the present invention for absorbing the sunlight and converting it into electrical energy, FIG. 2 is a view showing a fullerene-triarylamine, to which a dopant is coupled, in which the fullerene-triarylamine is formed by coupling a fullerene derivative with a triarylamine derivative, and FIG. 3 is a view showing an adduct prepared according to an example of the present invention.

Figure 4:
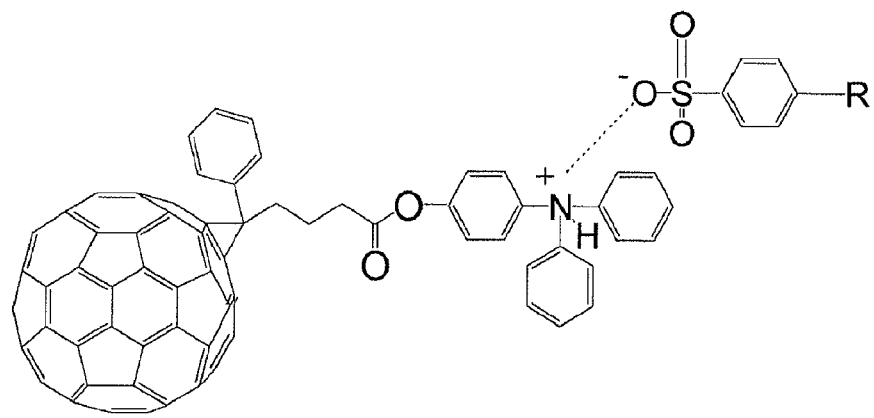
FIG. 4 is a view showing a fullerene-triarylamine, to which a dopant is coupled, in which the fullerene-triarylamine is formed by coupling a fullerene derivative containing a hydrocarbon derivative, which is bonded to a benzene ring, with a triarylamine derivative.
Figure 5:
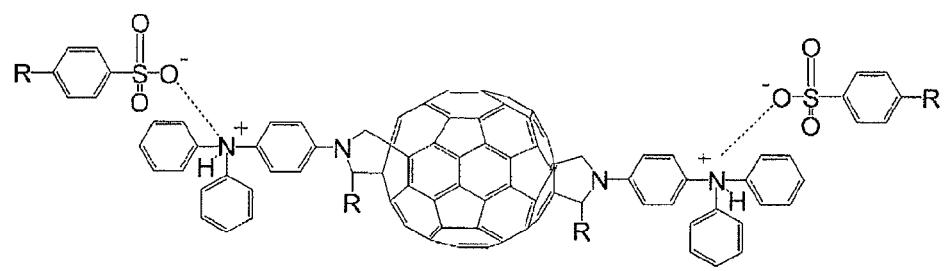
FIG. 5 is a view showing a fullerene-triarylamine, to which a dopant is coupled, in which the fullerene-triarylamine is formed by coupling a fullerene derivative, which is bonded to two aromatic hydrocarbon derivatives, with two triarylamine derivatives.
Figure 6:
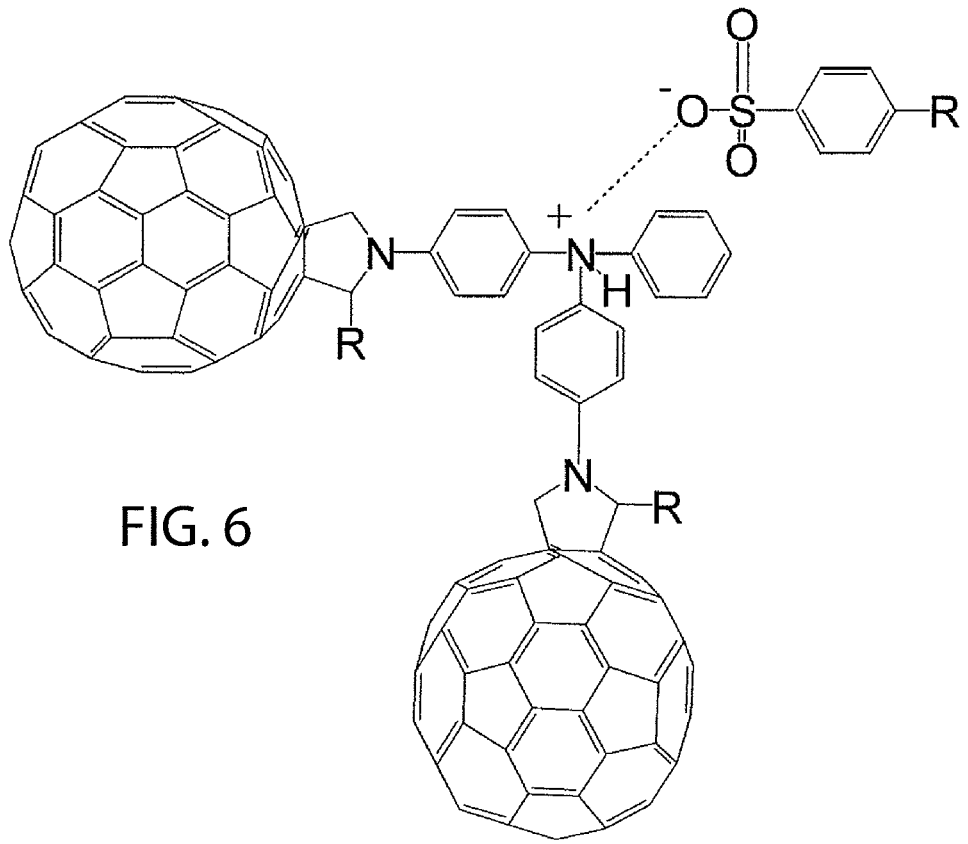
FIG. 6 is a view showing a fullerene-triarylamine, to which a dopant is coupled, in which the fullerene-triarylamine is formed by coupling two fullerene derivatives, which are bonded to an aromatic hydrocarbon derivative, with a triarylamine derivative.

In addition, FIG. 4 is a view showing a fullerene-triarylamine, to which a dopant is coupled, in which the fullerene-triarylamine is formed by coupling a fullerene derivative containing a hydrocarbon derivative, which is bonded to a benzene ring, with a triarylamine derivative, FIG. 5 is a view showing a fullerene-triarylamine, to which a dopant is coupled, in which the fullerene-triarylamine is formed by coupling a fullerene derivative, which is bonded to two aromatic hydrocarbon derivatives, with two triarylamine derivatives, and FIG. 6 is a view showing a fullerene-triarylamine, to which a dopant is coupled, in which the fullerene-triarylamine is formed by coupling two fullerene derivatives, which are bonded to an aromatic hydrocarbon derivative, with a triarylamine derivative.

Figure 7:
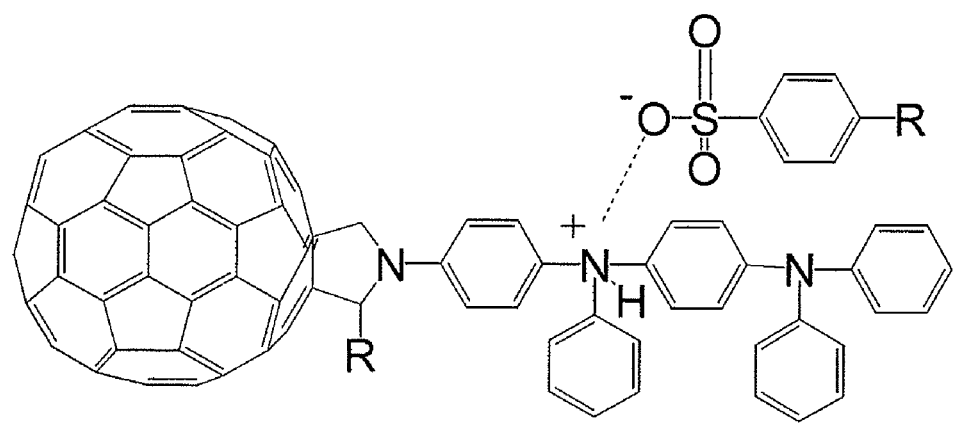
FIG. 7 is a view showing a fullerene-triarylamine, to which a dopant is coupled, in which the fullerene-triarylamine is formed by coupling a fullerene derivative, which is bonded to an aromatic hydrocarbon derivative, with a triarylamine derivative, which is bonded to triarylamine.
Figure 8:
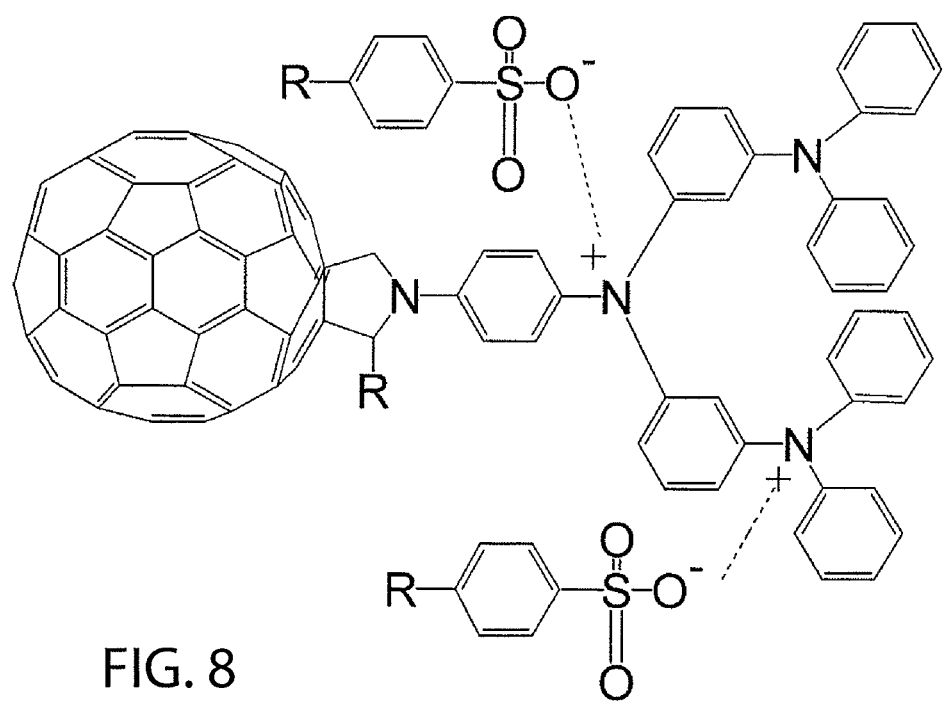
FIG. 8 is a view showing a fullerene-triarylamine, to which a dopant is coupled, in which the fullerene-triarylamine is formed by coupling a fullerene derivative, which is bonded to an aromatic hydrocarbon derivative, with a triarylamine derivative, in which each benzene ring of the triarylamine derivative is coupled with triarylamine.

Further, FIG. 7 is a view showing a fullerene-triarylamine, to which a dopant is coupled, in which the fullerene-triarylamine is formed by coupling a fullerene derivative, which is bonded to an aromatic hydrocarbon derivative, with a triarylamine derivative, which is bonded to triarylamine, and FIG. 8 is a view showing a fullerene-triarylamine, to which a dopant is coupled, in which the fullerene-triarylamine is formed by coupling a fullerene derivative, which is bonded to an aromatic hydrocarbon derivative, with a triarylamine derivative, in which each benzene ring of the triarylamine derivative is coupled with triarylamine.

The present invention relates to a compound for absorbing sunlight and converting it into electrical energy. The sunlight absorbed by the compound of the present invention includes infrared rays, visible light, and ultraviolet rays. The ultraviolet rays contain UVA long wavelengths, UVB medium wavelengths, and UVC short wavelengths. The compound of the present invention absorbs light over a broad range of wavelengths depending on the triarylamine derivatives. The compound includes those formed by coupling fullerene derivatives and at least one or more triarylamine derivatives, which absorb the light energy and convert in into electrical energy.

In order to prepare the chemical compound for absorbing the sunlight according to the present invention, the fullerene derivative must be coupled with the triarylamine derivative. Referring to FIG. 1, fullerene looks like a hexagon-shaped carbon ball, and A to G (whether they are capital letters or lowercase letters) represent hydrocarbon compounds bonded with nitrogen atoms (N). Furthermore, d represents a dopant, n and o are natural numbers greater than 1, and l and m are non-negative integers.

Fullerene can be found in the soot that remains after a laser beam is radiated onto graphite pieces. Fullerene is a stable material having the same structure as a soccer ball. Carbon atoms of the fullerene form $sp^2$ hybrid orbits, and the fourth valence electron is contained in the p orbital function, which is stretched perpendicular to the surface of the sphere. The orbits form electron clouds of π (pi) bonds inside and outside of the sphere by overlapping each other. The electron cloud has the same shape as that of the π (pi) bond in benzene. Fullerene has the property of high stability for the above-mentioned reason. Fullerene rarely reacts with other materials and is not dissolved easily in solvent due to this property of high stability. Thus, a fullerene derivative is needed to make the compound of the present invention. The fullerene derivative consists of fullerenes having carbon numbers 60, 70, 78, 82 or 84.

The stable fullerene can be coupled with a triarylamine derivative. The triarylamine derivative may have various structures depending on the lengths and polarities of the functional groups, and has hole transportation characteristics depending on the structure. Moreover, the performance and the reliability of the solar battery are influenced by the structure of the functional group coupled to the triarylamine derivative.

The triarylamine derivative can be coupled with at least one or more aliphatic or aromatic hydrocarbons, and can also be coupled with a dopant. The aliphatic hydrocarbons include unsaturated hydrocarbons and saturated hydrocarbons. The saturated hydrocarbons include alkanes ($C_nH_{2n+2}$), and the unsaturated hydrocarbons include alkenes ($C_nH_{2n}$) and alkynes ($C_nH_{2n-2}$). In addition, cycloalkanes ($C_nH_{2n}$), which have a carbon skeleton ring, are included in spite of being saturated hydrocarbons. Derivatives of the aliphatic hydrocarbons, in which one or more hydrogen atoms of the aliphatic hydrocarbon molecules, besides the hydrocarbons, contain other atoms or radicals, are included. Isomers of the aliphatic hydrocarbons as well as the aliphatic hydrocarbons are included.

The aromatic hydrocarbons include hydrocarbons containing a benzene group and hydrocarbons other than benzene, such as naphthalene, anthracene, toluene, xylene, and styrene. Moreover, the aromatic hydrocarbons include aromatic hydrocarbon derivatives such as phenols, aromatic carboxylic acids, aromatic nitro compounds, and aromatic amine series compounds.

The aliphatic or aromatic hydrocarbons already coupled with the triarylamine derivative can be coupled with at least one or more triarylamine derivatives again to extend the length of the triarylamine derivative and to form a bridge bond. The structure, polarity and length of the entire compound can be transformed depending on the structure, polarity and length of the functional groups bonded to the triarylamine. As fullerene is a stable material, it is influenced highly by the structure or kind of functional groups bonded to the triarylamine derivative.

The dopant is an acid, and the acid is selected from the group consisting of benzenesulfonic acid, sulfuric acid ($H_2SO_4$), and antimony fluoride ($SbF_6$). The dopant is an impurity that is intentionally added to a semiconductor to change the electric conductivity. The dopant can react with noncovalent electron pairs of nitrogen atoms to conduct a doping reaction.

In a method of preparing the compound, the compound is formed by the process consisting of the steps of: synthesizing a fullerene derivative; synthesizing fullerene-triarylamine, wherein a fullerene-triarylamine adduct is prepared by coupling the fullerene derivative with a triarylamine derivative; preparing an adduct solution by dissolving the fullerene-triarylamine adduct in an organic solvent; and conducting a doping reaction by adding an acid dropwise slowly to the adduct solution.

As fullerene is a stable material, it has low solubility in an organic solvent, and thus phase separation might happen when it is combined in a mixed solution with a semiconductive polymer. Therefore, the fullerene should be prepared as a fullerene derivative. The fullerene derivative is one in which organic substituents account for a relatively small part thereof compared to most other fullerenes. The fullerene derivative at the step of synthesizing the fullerene derivative is prepared by selecting one from those having carbon numbers $C_{60}$, $C_{70}$, $C_{78}$, $C_{82}$ and $C_{84}$.

In the step of synthesizing the fullerene derivative, the fullerene derivative is synthesized by heating the fullerene and the N-substituted glycine in toluene. The molar ratio of the fullerene to the N-substituted glycine ranges from 0.1:1 to 10:1, and the heating reaction is conducted in toluene for a time period ranging from one hour to 24 hours at a temperature ranging from room temperature to 300° C. If the temperature is below room temperature, the reaction does not occur, and if the temperature is over 300° C., the reaction occurs too completely, thus decomposing the products. Thus, the temperature range should be within the above-mentioned range. Moreover, if the reaction time is less than an hour, the reaction does not occur sufficiently, and if the reaction time is more than 24 hours, economic efficiency suffers. Therefore, the reaction time should be within the above-mentioned reaction time. Further, if the molar ratio of fullerene is less than 0.1, the resulting product of the fullerene derivative will be present in a very small amount, and if the molar ratio of the fullerene is more than 10, a lot of unreacted fullerene will remain. Thus, the molar ratio should be within the above-mentioned molar ratio range.

To couple the triarylamine derivative to the synthesized fullerene, a step of synthesizing the fullerene-triarylamine is needed. The triarylamine derivative at the step of synthesizing the fullerene-triarylamine is bromotriarylamine, and the fullerene derivative at the step of synthesizing the fullerene derivative can react with bromotriarylamine and 2-phenylphenol in an organic solvent. Iodotriarylamine or chlorotriarylamine can be used instead of bromotriarylamine.

At the step of synthesizing the fullerene-triarylamine, the fullerene derivative and the triarylamine derivative are reacted with a molar ratio ranging from 0.1:1 to 10:1 for a time period ranging from 8 hours to 72 hours at a temperature ranging from room temperature to 300° C. If the temperature is below room temperature, the reaction does not occur, and if the temperature is over 300° C., the reaction occurs too completely, thus decomposing the products. Thus, the temperature range should be within the above-mentioned range. Moreover, if the reaction time is less than 8 hours, the reaction does not occur sufficiently, and if the reaction time is more than 72 hours, economic efficiency is lowered. Therefore, the reaction time should be within the above-mentioned reaction time. Further, if the molar ratio of the fullerene derivative is less than 0.1, the resulting product of the fullerene-triarylamine will be present in a very small amount, and if the molar ratio of the fullerene derivative is more than 10, a lot of unreacted fullerene derivative will remain. Thus, the molar ratio should be within the above-mentioned range of the molar ratio.

Since Bromine (Br), Iodine (I), and chlorine (Cl) of bromotriarylamine, iodotriarylamine and chlorotriarylamine respectively have strong electronegativity, which strongly attracts an electric charge, they become $\delta^-$, and the nitrogen element of amine becomes $\delta^+$ to make the reaction happen. As a catalyst to aid the reaction, copper iodide (CuI) and calcium phosphate ($K_3PO_4$) can be used. In general, Palladium (Pd) catalyst is usually used in arylation, but if copper (Cu) bonded to iodine (I) is used as a catalyst, it makes the reaction occur more easily and quickly than the Palladium (Pd) catalyst.

Referring to FIG. 3, it shows the molecular structure of the adduct of fullerene-triphenylamine produced in the above-mentioned reaction. Since the adduct allows electrical charges in molecules to move easily and does not have the effect of a solar battery, the adduct should be passed through a doping reaction with a dopant after being produced as a solution.

The organic solvent at the step of preparing the adduct solution can be selected from the group consisting of toluene, xylene, chlorobenzene, and dichlorobenzene. Since the materials have benzene groups and the double bonds of benzene have a resonant structure, they allow electrical charges in molecules to move easily, and also make a doping reaction occur easily. Moreover, the organic solvent plays the role of improving the energy conversion efficiency of the compound. The adduct solution should be passed through a doping reaction after being produced.

An acid can be used as a dopant at the step of conducting a doping reaction, and the acid can be selected from the group consisting of benzenesulfonic acid, sulfuric acid ($H_2SO_4$), and antimony fluoride ($SbF_6$).

As the compound, which is prepared according to the method of preparing the same, absorbs sunlight and converts it into electrical energy, it can be used in a solar battery, a transistor, a varistor, a semiconductor, etc.

MODE FOR INVENTION

Now, referring to the drawings, Example 1 is used to further describe or illustrate the method of preparing the compound of the present invention. Example 2 is used to further describe or illustrate the compound being prepared according to the method of the present invention. The examples are given for illustration of the invention and are not intended to be limiting thereof.

EXAMPLES

Example 1

To synthesize a fullerene derivative, 100 mg (0.14 mmol) of fullerene ($C_{60}$), 0.70 mmol of aldehyde, and 0.14 mmol of N-substituted glycine were heated in 50 Ml of toluene for 2 hours. In order to couple the fullerene with the triarylamine, copper iodide (CuI) and potassium phosphate ($K_3PO_4$) were put in a screw-capped test tube, and then the test tube was emptied and filled with argon. The copper iodide (CuI) and potassium phosphate ($K_3PO_4$) were used as metal catalysts.

1.2 mmol of the fullerene derivative at the step of synthesizing the fullerene derivative, 1.0 mmol of the bromotriarylamine and 2.0 mmol of 2-phenylphenol were reacted in an organic solvent for a time period ranging from 18 hours to 22 hours at a temperature of 100° C. in the test tube.

Iodotriarylamine or chlorotriarylamine can be used instead of the bromotriarylamine. If the iodotriarylamine is used, 1.2 mmol of the fullerene derivative at the step of synthesizing the fullerene derivative, 1.0 mmol of the iodotriarylamine and 2.0 mmol of 2-phenylphenol are reacted in an organic solvent for 18 hours at a temperature of 80° C. An adduct is produced after passing through the reaction. Since the electrons of the resulting adduct do not move actively when light is radiated thereon, the adduct should be passed through a doping reaction after being prepared as a solution.

The adduct can be dissolved in an organic solvent such as toluene, xylene, chlorobenzene, and dichlorobenzene to prepare an adduct solution. The doping reaction can be progressed by dropping a solution of alkylbenzenesulfonic acid into the adduct solution slowly. In the adduct solution passed through the doping reaction, since electrical charges can move freely, energy is generated upon exposure to light. The time taken for the doping reaction is more than an hour, and the length of the reaction time can be changed depending on the concentration of the adduct solution. Therefore, if the adduct solution is highly concentrated, the reaction time can be extended.

Referring to FIG. 2, it shows the compound of the present invention is doped after reacting alkylbenzenesulfonic acid with fullerene-triarylamine.

Example 2

Referring to FIG. 4 to FIG. 8, they show examples prepared according to the method of the present invention. FIG. 4 illustrates that the compound for absorbing sunlight can be prepared by coupling a triarylamine to the fullerene, which is already bonded to a hydrocarbon chain containing a benzene group, and using benzenesulfonic acid as a dopant.

FIG. 5 illustrates that the compound for absorbing the sunlight can be prepared by coupling two triarylamines to a fullerene derivative, which is already bonded to two aliphatic hydrocarbon derivatives, and using benzenesulfonic acid as a dopant.

FIG. 6 illustrates that the compound for absorbing the sunlight can be prepared by coupling a triarylamine to two fullerene derivatives, which are already bonded to an aliphatic hydrocarbon derivative, and using benzenesulfonic acid as a dopant.

FIG. 7 illustrates that the compound for absorbing the sunlight can be prepared by coupling a triarylamine, which is already bonded to another triarylamine, to a fullerene, which is already bonded to an aliphatic hydrocarbon derivative, and using benzenesulfonic acid as a dopant.

FIG. 8 illustrates that the compound for absorbing the sunlight can be prepared by coupling triarylamines to a fullerene, which is already bonded to an aliphatic hydrocarbon derivative, and using benzenesulfonic acid as a dopant, wherein the triarylamine is already bonded to each benzene group of the triarylamines.

Meanwhile, the compound for absorbing the sunlight and converting it into electrical energy according to the present invention uses organic material. If a solar battery is prepared using the organic material, it is advantageous if the material is plastic. If a solar battery is prepared by synthesizing the organic material, the solar battery can be used in various applications because the organic material can be bent or folded, unlike silicone.

Moreover, the compound of the present invention can be used to prepare a solar battery as a thin film having a thickness on the scale of hundreds of nanometers due to the above-mentioned characteristics. Up-scaling of the organic solar battery becomes easy thanks to the advantages of the compound of the present invention. The characteristics of a polymer solar battery that make it suitable as a solar battery having a flexible shape make it possible to adapt the polymer solar battery to various applications, such as a power source in future portable flexible information systems.

If this solar battery is attached to cloth, the development of new concept clothes having a warming function capable of absorbing sunlight in winter is possible. Further, in the case of designing a building using sunlight, the exterior of the building can be curved while incorporating a plastic solar battery.

The solar battery of the present invention can be attached to a portable electronic newspaper. Since the cost of preparing the solar battery is cheap, it can be used in disposable electronic appliances. Therefore, the compound of the present invention is very useful and future-oriented.

Although the present invention has been explained referring to the Examples shown in the drawings, this is only for illustration. A person having ordinary skill in the art will understand that various modifications and equivalent examples are possible. Therefore, the scope of protection of the present invention is limited only by the technical spirit of the following claims.

INDUSTRIAL APPLICABILITY

Using the compound of the present invention, mass production of the solar battery is possible and production costs can be reduced. Therefore, the compound of the present invention can be used in industrial fields related to solar batteries having high industrial applicability.

The invention claimed is:

1. A solar battery comprising a compound for absorbing sunlight and converting the sunlight into electrical energy, wherein the compound is a fullerene coupled to at least one triarylamine, and wherein the compound is selected from the group consisting of

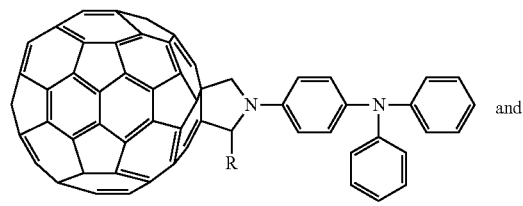

and

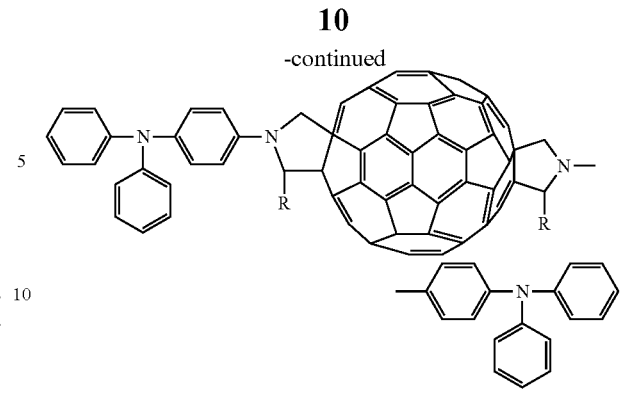

wherein each R is independently selected from the group consisting of hydrogen, an aliphatic hydrocarbon and an aromatic hydrocarbon, the fullerene selected from among fullerene derivatives having carbon numbers $C_{60}$, $C_{70}$, $C_{78}$, $C_{82}$ and $C_{84}$.

2. The solar battery according to claim 1, wherein the fullerene is selected from the fullerene derivative having carbon number $C_{60}$.

3. The solar battery according to claim 1, wherein the at least one triarylamine is coupled to at least one or more aliphatic or aromatic hydrocarbons, and also coupled to a dopant.

4. The solar battery according to claim 3, wherein the one or more aliphatic or aromatic hydrocarbons are coupled to at least one or more triarylamines.

5. The solar battery according to claim 3, wherein the dopant is an acid, which is one selected from the group consisting of benzenesulfonic acid, sulfuric acid ($H_2SO_4$), and antimony fluoride ($SbF_6$).

6. A solar battery comprising a compound for absorbing sunlight and converting the sunlight into electrical energy, wherein the compound is a fullerene coupled to at least one triarylamine, wherein the triarylamine is coupled to a dopant, and wherein the compound is selected from the group consisting of

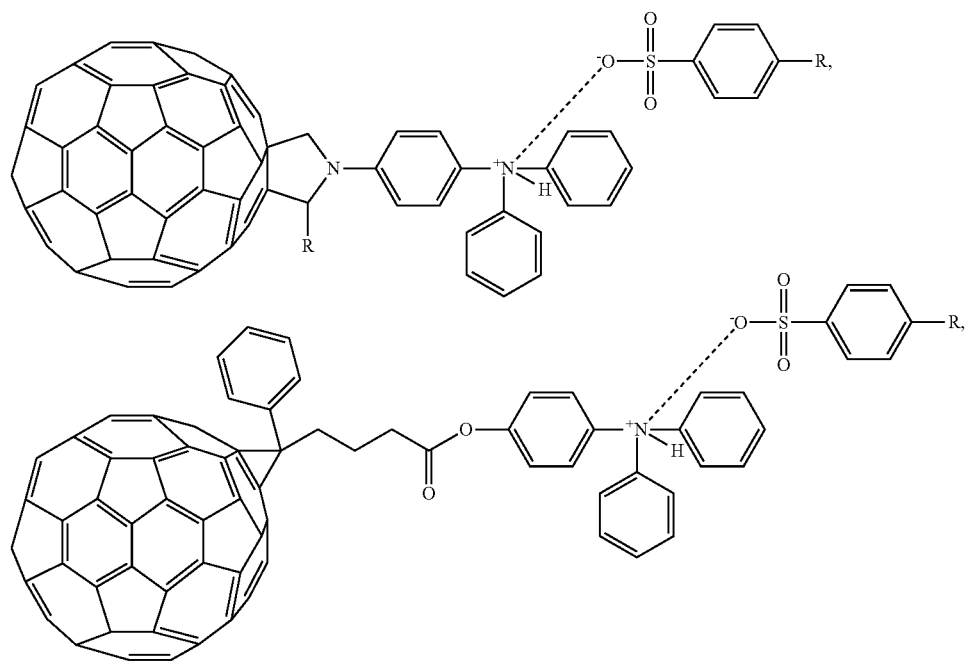

11
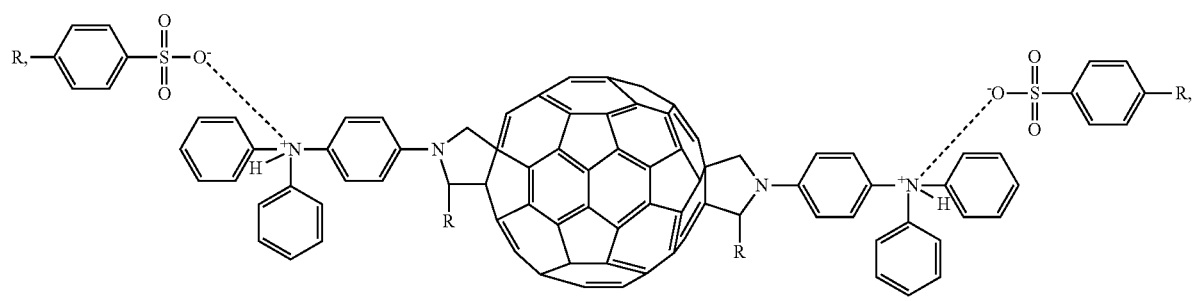
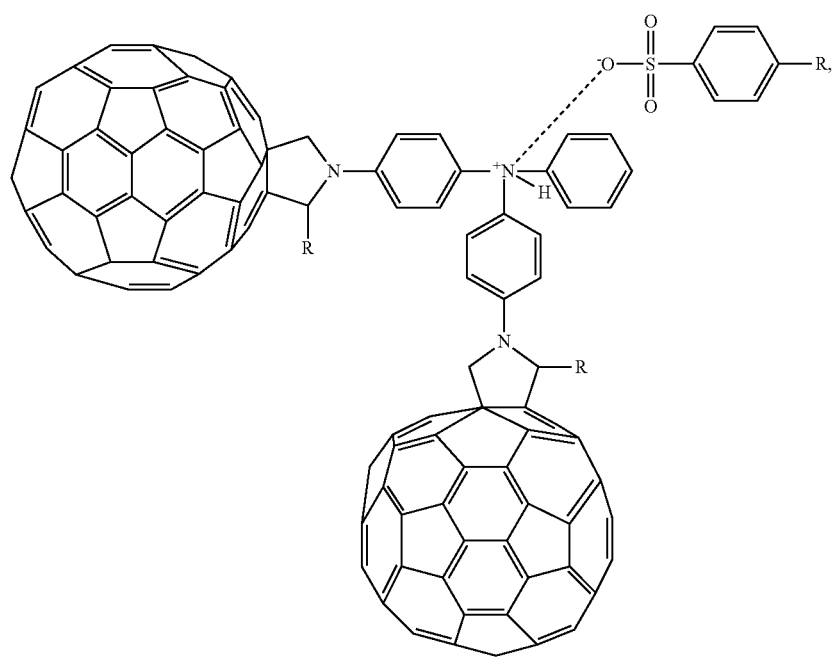
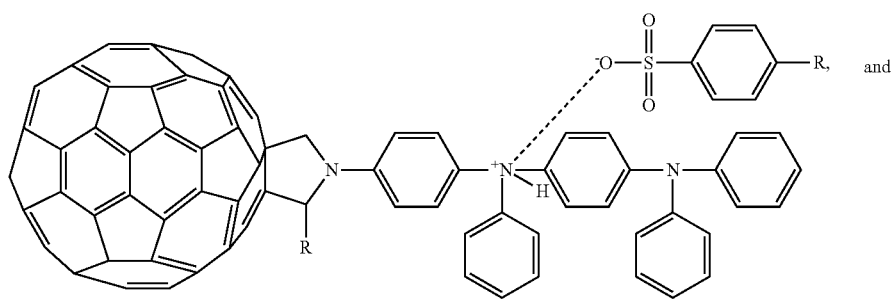
12

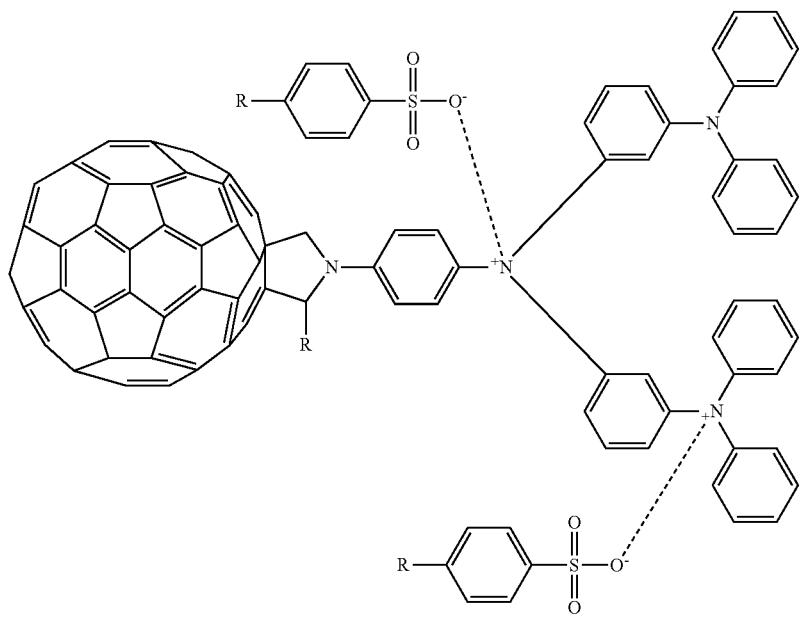

wherein each R is independently selected from the group consisting of hydrogen, an aliphatic hydrocarbon and an aromatic hydrocarbon.

7. The solar battery according to claim 6, wherein the fullerene is selected from among fullerene derivatives having carbon numbers $C_{60}$, $C_{70}$, $C_{78}$, $C_{82}$ and $C_{84}$.

8. The solar battery according to claim 6, wherein the at least one triarylamine is coupled to at least one or more aliphatic or aromatic hydrocarbons.

9. The solar battery according to claim 8, wherein the one or more aliphatic or aromatic hydrocarbons are coupled to at least one or more triarylamines.

10. A method of manufacturing a compound for absorbing sunlight and converting it into electrical energy, the method comprising:
  synthesizing a fullerene derivative;
  synthesizing fullerene-triarylamine, wherein a fullerene-triarylamine adduct is prepared by coupling the fullerene derivative with a triarylamine derivative;
  preparing an adduct solution by dissolving the fullerene-triarylamine adduct in an organic solvent; and conducting a doping reaction by adding an acid dropwise slowly to the adduct solution,
wherein the compound is a fullerene coupled to at least one triarylamine, and wherein the compound is selected from the group consisting of

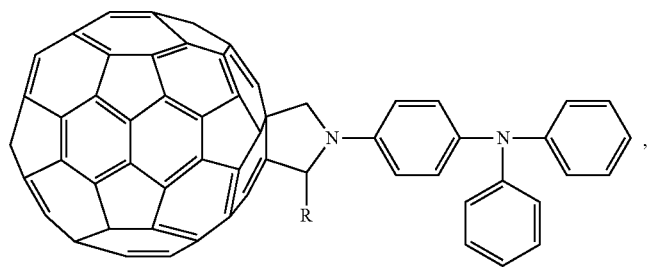

,

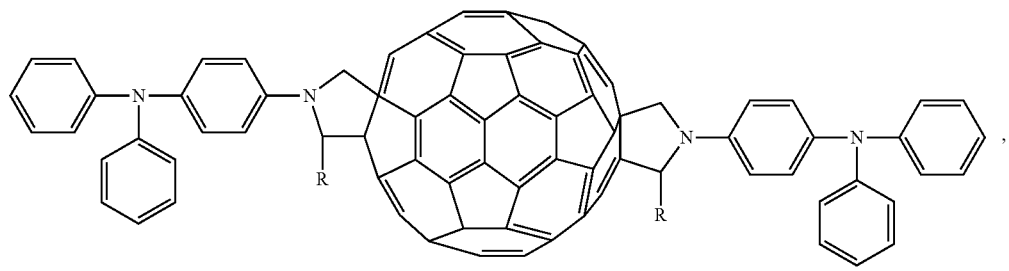

,

-continued
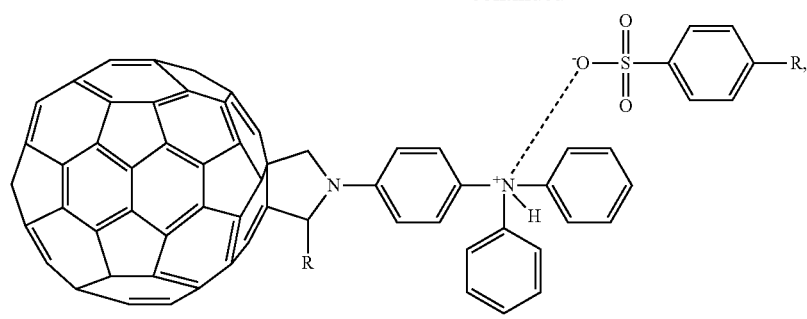
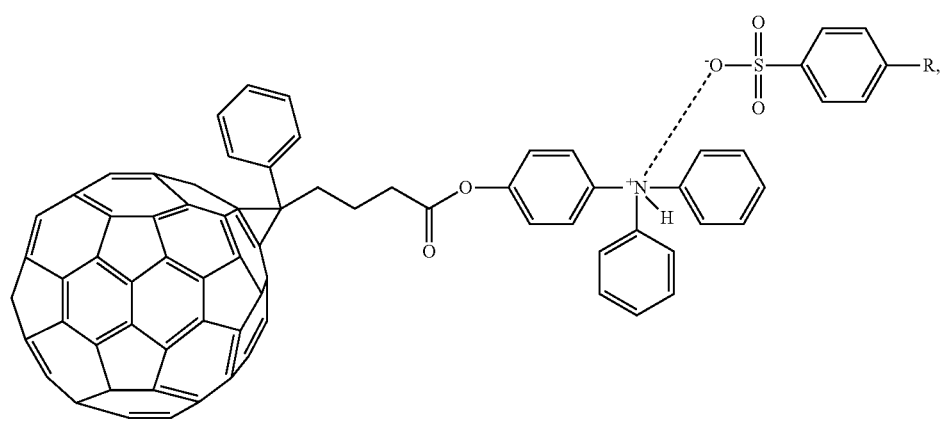
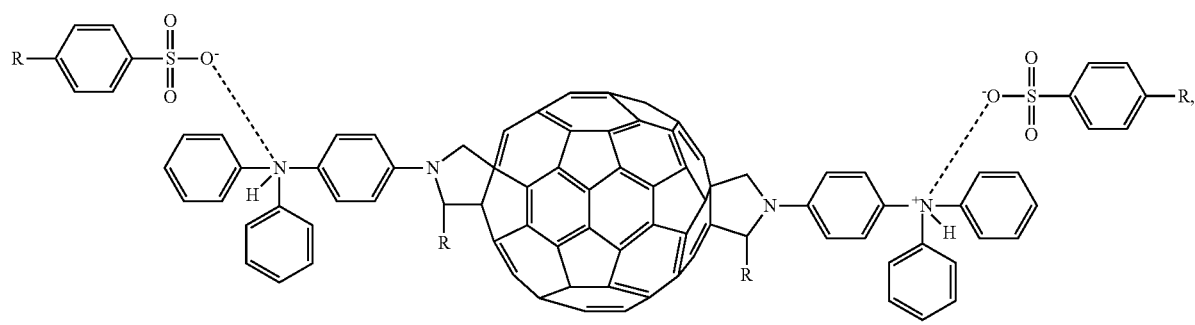

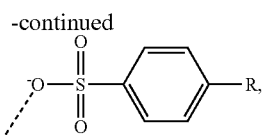

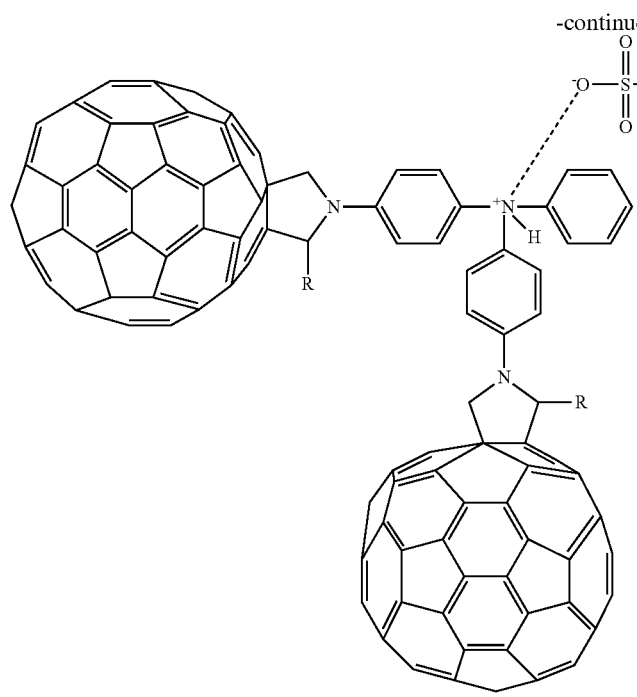

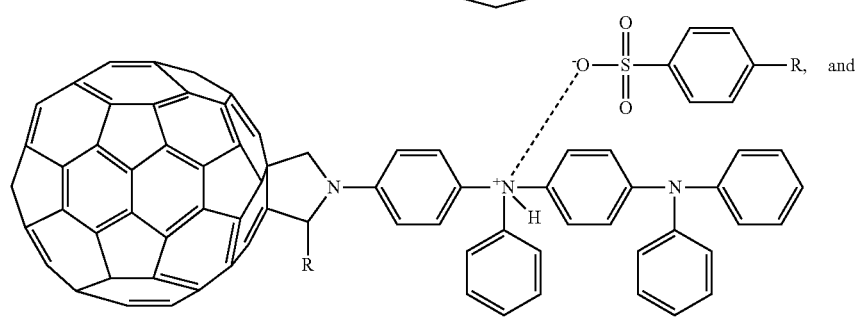

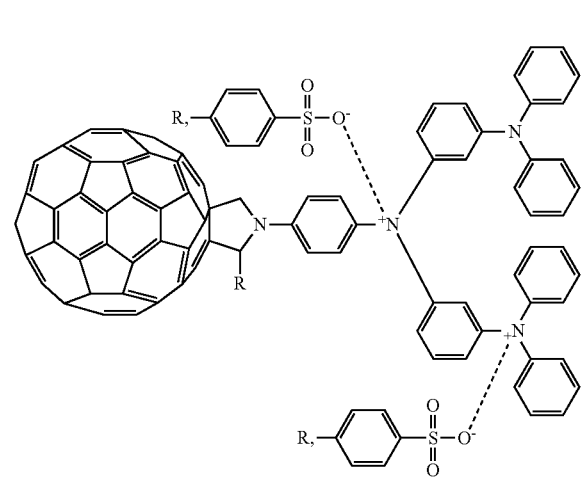

wherein each R is independently selected from the group consisting of hydrogen, an aliphatic hydrocarbon and an aromatic hydrocarbon, the fullerene selected from among fullerene derivatives having carbon numbers $C_{60}$, $C_{70}$, $C_{78}$, $C_{82}$ and $C_{84}$.

11. The method according to claim 10, wherein the fullerene derivative is selected from the fullerene derivative having carbon number $C_{60}$.

12. The method according to claim 10, wherein, in synthesizing a fullerene derivative, the fullerene derivative is produced by heating the fullerene and an N-substituted glycine in toluene.

13. The method according to claim 10, wherein, in synthesizing a fullerene-triarylamine, the triarylamine derivative is synthesized by selecting one from the group consisting of bromotriarylamine, iodotriarylamine and chlorotriarylamine, and reacting the synthesized fullerene derivative, the selected triarylamine and 2-phenylphenol in an organic solvent.

14. The method according to claim 12, wherein in synthesizing a fullerene derivative, the fullerene derivative synthesized by heating the fullerene and the N-substituted glycine at a molar ratio ranging from 0.1:1 to 10:1 in toluene for a time period ranging from one hour to 24 hours at a temperature ranging from room temperature to 300° C. to produce a fullerene derivative.

15. The method according to claim 13, wherein the molar ratio of the fullerene derivative to the triarylamine derivative is from 0.1:1 to 10:1, and the reaction is conducted at a temperature ranging from room temperature to 300° C. for a time period ranging from 8 hours to 72 hours.

16. The method according to claim 10, wherein the organic solvent of the step of preparing the adduct solution is one selected from the group consisting of toluene, xylene, chlorobenzene, and dichlorobenzene.

17. The method according to claim 10, wherein the dopant of the step of a doping reaction is an acid, which is selected from the group consisting of benzenesulfonic acid, sulfuric acid ($H_2SO_4$), and antimony fluoride ($SbF_6$).

* * * * *